(12) United States Patent
Xiao et al.

(10) Patent No.: US 11,720,013 B2
(45) Date of Patent: Aug. 8, 2023

(54) GRADED INTERFACE IN BRAGG REFLECTOR

(71) Applicant: Applied Materials, Inc., Santa Clara, CA (US)

(72) Inventors: Wen Xiao, Singapore (SG); Vibhu Jindal, San Jose, CA (US); Weimin Li, Singapore (SG); Shuwei Liu, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/708,593

(22) Filed: Mar. 30, 2022

(65) Prior Publication Data

US 2022/0221786 A1 Jul. 14, 2022

Related U.S. Application Data

(62) Division of application No. 16/850,665, filed on Apr. 16, 2020, now Pat. No. 11,327,394.

(60) Provisional application No. 62/836,135, filed on Apr. 19, 2019.

(51) Int. Cl.
*G03F 1/24* (2012.01)
*G02B 5/08* (2006.01)
*G03F 7/00* (2006.01)
*G03F 7/20* (2006.01)

(52) U.S. Cl.
CPC .............. *G03F 1/24* (2013.01); *G02B 5/0891* (2013.01); *G03F 7/7015* (2013.01); *G03F 7/70316* (2013.01)

(58) Field of Classification Search
CPC ...... G03F 1/24; G03F 7/7015; G03F 7/70316; G02B 5/0891
See application file for complete search history.

(56) References Cited

U.S. PATENT DOCUMENTS

| | | | |
|---|---|---|---|
| 6,132,566 A | 10/2000 | Hofmann et al. | |
| 6,396,900 B1 | 5/2002 | Barbee, Jr. et al. | |
| 6,606,199 B2 | 8/2003 | Wang | |
| 9,580,796 B2 | 2/2017 | Ritchie et al. | |
| 9,812,303 B2 | 11/2017 | Ritchie et al. | |
| 2003/0019739 A1 | 1/2003 | Shibamoto et al. | |
| 2005/0133365 A1 | 6/2005 | Hong et al. | |
| 2005/0186485 A1 | 8/2005 | Yoshikawa et al. | |
| 2010/0027107 A1 | 2/2010 | Yakshin et al. | |
| 2012/0322000 A1 | 12/2012 | Uno et al. | |

(Continued)

FOREIGN PATENT DOCUMENTS

KR 20110120785 A 11/2011

OTHER PUBLICATIONS

"Non-Final Office Action in U.S. Appl. No. 16/801,621, dated Jun. 9, 2021, 23 pages".

(Continued)

*Primary Examiner* — Hung V Nguyen
(74) *Attorney, Agent, or Firm* — Servilla Whitney LLC

(57) ABSTRACT

A multilayer stack in the form of a Bragg reflector comprising a graded interfacial layer and a method of manufacturing are disclosed. The graded interfacial layer eliminates the formation of low-reflectivity interfaces in a multilayer stack and reduces roughness of interfaces in a multilayer stack.

16 Claims, 10 Drawing Sheets

(56) References Cited

U.S. PATENT DOCUMENTS

| | | | |
|---|---|---|---|
| 2013/0062610 A1* | 3/2013 | Clark | H01L 33/10 |
| | | | 257/E33.072 |
| 2013/0209927 A1 | 8/2013 | Deweerd | |
| 2013/0323626 A1 | 12/2013 | Chang | |
| 2014/0007935 A1 | 1/2014 | Mutitu et al. | |
| 2015/0262797 A1 | 9/2015 | Ishihara et al. | |
| 2016/0011344 A1 | 1/2016 | Beasley et al. | |
| 2016/0161839 A1 | 6/2016 | Lu et al. | |
| 2017/0053784 A1 | 2/2017 | Subramani et al. | |
| 2017/0115555 A1 | 4/2017 | Hofmann et al. | |
| 2017/0131637 A1 | 5/2017 | Hofmann et al. | |
| 2017/0178877 A1 | 6/2017 | Wang et al. | |
| 2019/0088456 A1 | 3/2019 | Behara et al. | |
| 2019/0382879 A1 | 12/2019 | Jindal et al. | |

OTHER PUBLICATIONS

"PCT International Search Report and Written Opinion in PCT/US2019/040682 dated Oct. 23, 2019, 13 pages".
"PCT International Search Report and Written Opinion in PCT/US2020/028669 dated Aug. 7, 2020, 14 pages".

* cited by examiner

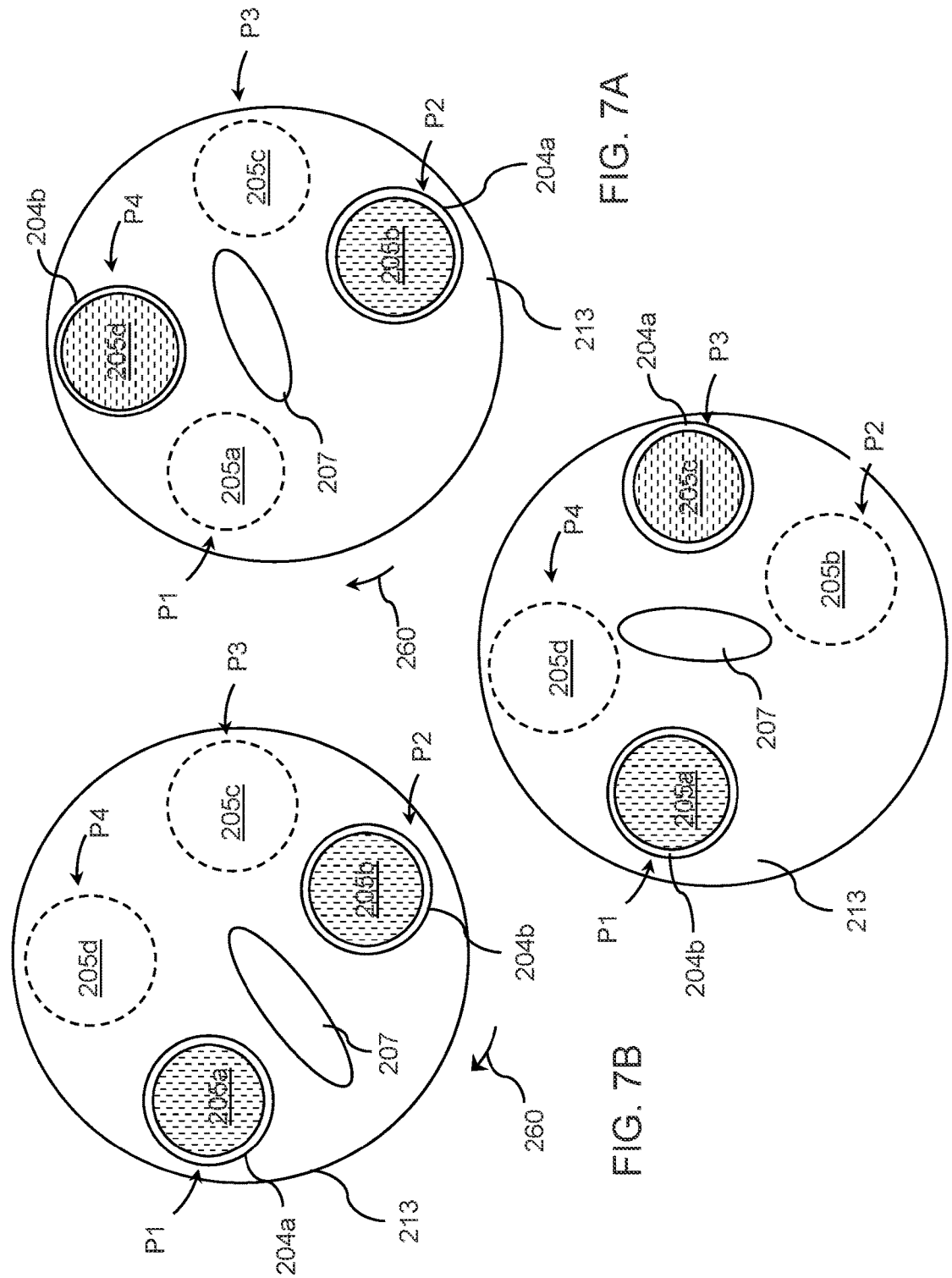

GRADED INTERFACE IN BRAGG REFLECTOR

CROSS-REFERENCE TO RELATED APPLICATIONS

This application is a divisional of U.S. application Ser. No. 16/850,665, filed Apr. 16, 2020, which issued as U.S. Pat. No. 11,327,394, and which claims priority to U.S. Provisional Application No. 62/836,135, filed Apr. 19, 2019, the entire disclosure of which is hereby incorporated by reference herein.

TECHNICAL FIELD

The present disclosure relates generally to Bragg reflectors, and more particularly, to Bragg reflectors, which may be utilized as extreme ultraviolet mask blanks, and methods of manufacture.

BACKGROUND

Bragg reflectors are utilized in a wide variety of applications, for example, in EUV mask blanks, optical filters (e.g. band-stop filters, notch filter etc.), fiber Bragg gratings, laser optics, polarizers, and waveguides (e.g. optics for head-mounted displays). Bragg reflectors are typically made of multilayers of alternating thin film materials of different refractive index, wherein high reflectance is one of the key attributes. A Bragg reflector or mirror is a structure formed from a multilayer stack of alternating thin film materials with varying refractive index, for example high- and low-index films. As a result of inter-layer mixing during multilayer depositions, additional interfacial layers form between adjacent layers of different materials. Bragg reflectors must have high reflectance. The structure and properties of the interfacial layers in the multilayer stack play a vital role in the reflectance of Bragg reflectors.

Extreme ultraviolet (EUV) lithography, also known as soft x-ray projection lithography, can be used for the manufacture of 0.0135 micron and smaller minimum feature size semiconductor devices. However, extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The formation of interfacial layers during multilayer depositions reduces the reflectance of Bragg reflectors. When a distinct interfacial layer forms between the alternating layers, there are interfaces which have low reflectivity towards EUV light, leading to reduction of overall reflectance of the multi-layer stack. Additionally, the distinct interfacial layers have higher roughness than the alternating layers, resulting in interfacial roughness that scatters incident light in random directions. The scattering effect reduces the overall reflectance of the multilayer stack.

Thus, there remains a need to improve reflectivity of the multilayer stack at EUV wavelengths.

SUMMARY

In a first aspect of the disclosure a Bragg reflector is provided, which comprises a multilayer stack of reflective layers on a substrate, the multilayer stack of reflective layers including a plurality of reflective layers including reflective layer pairs of a first material A and a second material B and graded interfacial layers between the first material A and the second material B, wherein the graded interfacial layers have a thickness, and the graded interfacial layers comprise a density gradient that changes across the thickness.

In a second aspect, a method of manufacturing Bragg reflector comprising alternating layers of first reflective material layer A and second reflective material layer B is provided. The method comprises depositing a uniform first reflective material layer A on a substrate; forming a first graded interfacial layer on the uniform first reflective material layer A, wherein the first graded interfacial layer comprises a thickness and a density gradient that changes across the thickness; depositing a uniform second reflective material layer B on the first graded interfacial layer; and forming a second graded interfacial layer on the uniform second reflective material layer B, wherein the second graded interfacial layer comprises a thickness and a density gradient that changes across the thickness.

In a third aspect, a method of manufacturing Bragg reflector is provided. The method comprises depositing a uniform first reflective material layer A on a substrate; forming a first graded interfacial layer on the first reflective material layer A, wherein the first graded interfacial layer comprises a gradient composition; depositing a uniform second reflective material layer B on the first graded interfacial layer; and forming a second graded interfacial layer on the second reflective material layer B, wherein the second graded interfacial layer comprises a gradient composition.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7A illustrates a step of a process according to an exemplary embodiment to form an extreme ultraviolet reflective element including a Bragg reflector according to one or more embodiments;

FIG. 7B illustrates a step of a process according to an exemplary embodiment to form an extreme ultraviolet reflective element including a Bragg reflector according to one or more embodiments; and FIG. 7C illustrates a step of a process according to an exemplary embodiment to form an extreme ultraviolet reflective element including a Bragg reflector according to one or more embodiments.

DETAILED DESCRIPTION

Figure 1A:
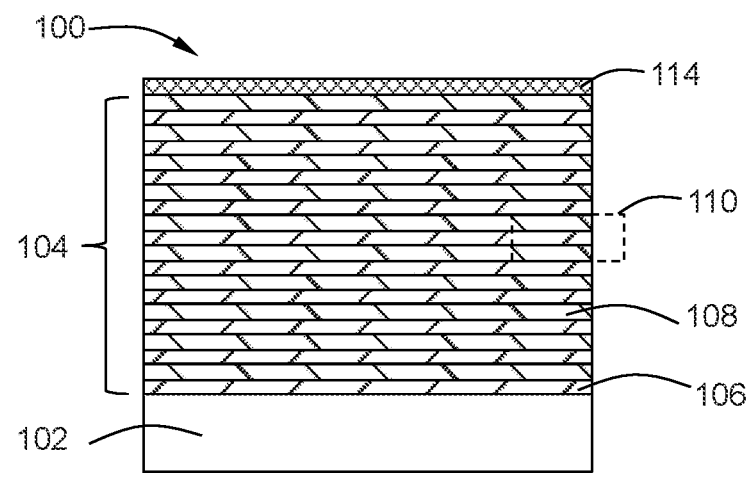
FIG. 1A illustrates a Bragg reflector according to the prior art.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used herein, the term "Bragg reflector" is a structure (e.g. a mirror) formed from a multilayer stack of alternating thin film materials with varying refractive index, for example high-index and low-index films. In one or more embodiments, the Bragg reflector is comprised of a multilayer stack of alternating thin film layers of molybdenum (Mo) and silicon (Si).

The disclosure, however, is not limited to alternating thin film layers of molybdenum and silicon. Unless specific materials or structures are recited in the claims of the disclosure, the claims directed to a Bragg reflector are not limited to a particular type of device or specific layer structure. In some embodiments, an EUV mask may comprise a Bragg reflector comprising alternating layers of molybdenum and silicon, or ruthenium and silicon, or zirconium and aluminum, or silicon carbide and magnesium, or chromium and cobalt.

In some embodiments, an X-ray mirror may comprise a Bragg reflector comprising alternating layers of tungsten and carbon, or tungsten and boron carbide ($B_4C$), or ruthenium and carbon, or platinum and carbon. In some embodiments, an optical filter such as a band-stop filter, a notch filter, etc., may comprise a Bragg reflector comprising alternating layers of $TiO_2$ and $SiO_2$. In some embodiments, a fiber Bragg grating may comprise a Bragg reflector comprising alternating layers of high and low refractive index germanium-doped $SiO_2$. In some embodiments, polarizer may comprise a Bragg reflector comprising alternating layers of silicon and magnesium, or SiC and magnesium or $SiO_2$ and aluminum. In some embodiments, a laser optical device may comprise a Bragg reflector comprising alternating layers of $Al_2O_3$ and Si and $SiO_2$. In some embodiments, waveguide (e.g., optics for head-mounted displays) may comprise a Bragg reflector comprising alternating layers of $Gd_3Ga_5O_{12}/TiO_2$ or Si/SiN.

An EUV mask operates on the principle of a distributed Bragg reflector. A substrate supports a multilayer (ML) mirror of 20-80 pairs of alternating layers of two materials.

The two materials have different refractive indices. While the following disclosure provides a specific example of an EUV mask blank including a Bragg reflector of alternating layers of Mo/Si, the principles described herein can be applied to any type of Bragg reflector, including the specific devices and alternating material layers described immediately above.

Lens elements and EUV mask blanks including a Bragg reflector must have high reflectivity towards EUV light. The lens elements and mask blanks of extreme ultraviolet lithography systems are coated with the reflective multilayer coatings of materials (e.g., molybdenum and silicon). Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer EUV light.

When the alternating layers are Mo/Si, distinct molybdenum silicide ($MoSi_x$) interfacial layers form between the alternating layers of molybdenum (Mo) and silicon (Si) in a multilayer stack, however, there are interfaces of $Mo/MoSi_x$ and $MoSi_x/Si$ which have low reflectivity towards EUV light, leading to reduction of overall reflectance of the Mo/Si multilayer stack. Additionally, the distinct interfacial layers of $MoSi_x$ have higher roughness than the alternating layers of Mo and Si, resulting in interfacial roughness that scatters incident light in random directions. The scattering effect reduces the overall reflectance of the Mo/Si multilayer stack.

Figure 1B:
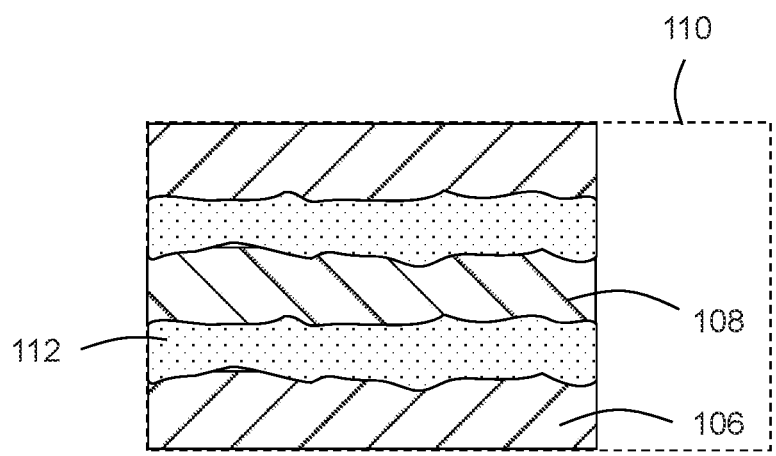
FIG. 1B is an enlarged view of the Bragg reflector of FIG. 1A according to the prior art.

With reference to FIGS. 1A and 1B, an extreme ultraviolent (EUV) reflective element 100 according to the prior art is shown. The extreme ultraviolet reflective element 100 is an EUV mask blank or an extreme ultraviolet mirror. The extreme ultraviolet reflective element 100 includes a substrate 102, a multilayer stack in the form of a Bragg reflector 104 of reflective layers 106, 108, and a capping layer 114.

FIG. 1B is an enlarged area 110 of the Bragg reflector 104. As shown in FIG. 1B, distinct interfacial layers 112 have higher roughness than the alternating reflective layers 106 and 108, resulting in interfacial roughness that scatters incident light in random directions. The scattering effect reduces the overall reflectance of the multilayer stack (i.e. Bragg reflector 104).

Embodiments of the disclosure are advantageously directed to a multilayer stack in the form of a Bragg reflector comprising a graded interfacial layer. As used herein, the term "graded interfacial layer" refers to an interfacial layer which has a gradual change in density or composition bridging two different materials of alternating layers of a multilayer stack.

In one or more embodiments, the graded interfacial layer eliminates the formation of low-reflectivity interfaces as a result of a distinct interfacial layer, for example, $Mo/MoSi_x$ and $MoSi_x/Si$ interfaces in a Mo/Si multilayer stack. In one or more embodiments, the graded interfacial layer reduces roughness of interfaces due to the formation of smooth graded interfacial layers instead of distinct rough interfacial layers.

In one or more embodiments, the graded interfacial layer adds greater than or equal to 2% reflectance for a Mo/Si multilayer stack for an EUV mask blank.

Figure 2A:
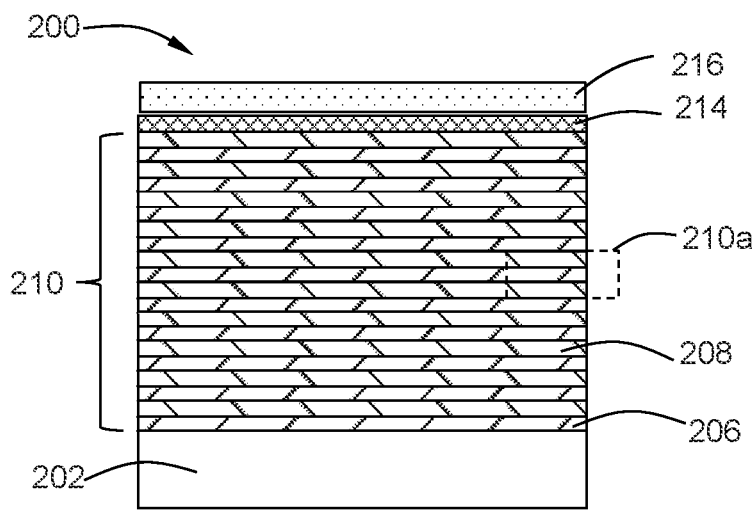
FIG. 2A illustrates an extreme ultraviolet reflective element according to one or more embodiments.
Figure 2B:
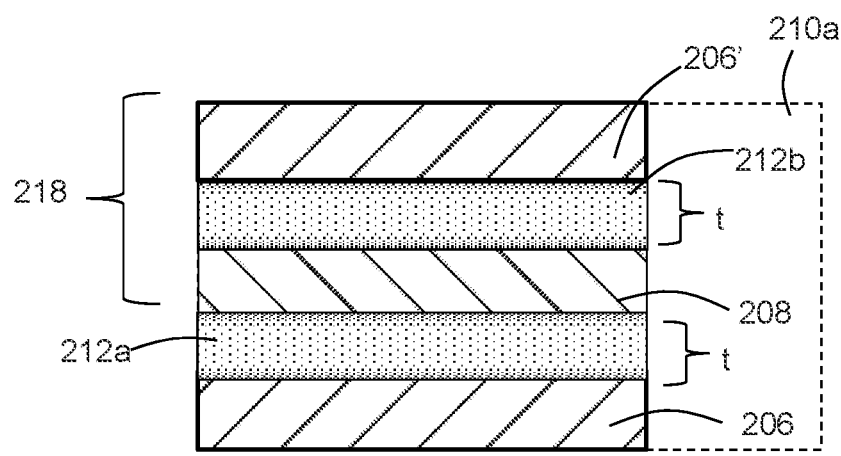
FIG. 2B is an enlarged view of the Bragg reflector of FIG. 2A according to one or more embodiments.

Referring to FIGS. 2A and 2B, an extreme ultraviolent (EUV) reflective element 200 according to one or more embodiments is shown. In one or more embodiments, the extreme ultraviolet reflective element 200 is an EUV mask blank or an extreme ultraviolet mirror. The extreme ultraviolet reflective element 200 includes a substrate 202, a multilayer stack 210 in the form of a Bragg reflector of reflective layers comprising first reflective layer 206, second reflective layer 208, and a capping layer 214.

FIG. 2B is an enlarged area 210a of the multilayer stack 210. As shown in FIG. 2B, graded interfacial layers 212a and 212b are formed on and between the alternating layers of first reflective layer 206 and second reflective layer 208 of the Bragg reflector 104.

In one or more embodiments, the substrate 202 is an element for providing structural support to the extreme ultraviolet reflective element 200. In one or more embodiments, the substrate 202 is made from a material having a low coefficient of thermal expansion (CTE) to provide stability during temperature changes. In one or more embodiments, the substrate 202 has properties such as stability against mechanical cycling, thermal cycling, crystal formation, or a combination thereof. The substrate 202 according to one or more embodiments is formed from a material such as silicon, glass, oxides, ceramics, glass ceramics, or a combination thereof.

The multilayer stack 210 is a Bragg reflector structure that is reflective to extreme ultraviolet light. The multilayer stack 210 includes alternating reflective layers of a first reflective layer 206 and a second reflective layer 208.

The first reflective layer 206 and the second reflective layer 208 form a reflective pair 218. In a non-limiting embodiment, the multilayer stack 210 includes a range of about 20 to about 60 of the reflective pairs 218 for a total of up to 120 reflective layers.

In one or more embodiments, the graded interfacial layers 212a and 212b have a gradual change in density or composition bridging two different materials of the alternating layers of the first reflective layer 206 and second reflective layer 208.

The first reflective layer 206 and the second reflective layer 208 can be formed from a variety of materials. In one or more embodiments, the first reflective layer 206 and the second reflective layer 208 are formed from silicon and molybdenum, respectively. Although the layers are shown as silicon and molybdenum, it is understood that the alternating layers can be formed from other materials or have other internal structures.

The first reflective layer 206 and the second reflective layer 208 can have a variety of structures. In one or more embodiments, both the first reflective layer 206 and the second reflective layer 208 are formed with a single layer, multiple layers, a divided layer structure, non-uniform structures, or a combination thereof.

Because most materials absorb light at extreme ultraviolet wavelengths, the optical elements used are reflective instead of the transmissive as used in other lithography systems. The multilayer stack 210 forms a reflective structure by having alternating thin layers of materials with different optical properties to create a Bragg reflector or mirror.

In one or more embodiments, each of the alternating layers 206, 208 has dissimilar optical constants for the extreme ultraviolet light. The alternating layers 206, 208 provide a resonant reflectivity when the period of the thickness of the alternating layers 206, 208 is one half the wavelength of the extreme ultraviolet light. In one or more embodiments, for the extreme ultraviolet light at a wavelength of 13 nm, the alternating layers 206, 208 are about 6.5 nm thick.

The multilayer stack 210 can be formed in a variety of ways. In an embodiment, the first reflective layer 206 and the second reflective layer 208 are formed by magnetron sputtering, ion sputtering systems, pulsed laser deposition, cathode arc deposition, or a combination thereof.

In an illustrative embodiment, the multilayer stack 210 is formed using a physical vapor deposition technique, such as magnetron sputtering. In an embodiment, the first reflective layer 206 and the second reflective layer 208 of the multilayer stack 210 have the characteristics of being formed by the magnetron sputtering technique including precise thickness, low roughness, and clean interfaces between the layers. In an embodiment, the first reflective layer 206 and the second reflective layer 208 of the multilayer stack 210 have the characteristics of being formed by the physical vapor deposition including precise thickness, low roughness, and clean interfaces between the layers.

The physical dimensions of the layers of the multilayer stack 210 formed using the physical vapor deposition technique can be precisely controlled to increase reflectivity. In an embodiment, the first reflective layer 206, such as a layer of silicon, has a thickness of 4.1 nm. The second reflective layer 208, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm can be reduced.

In an embodiment, the multilayer stack 210 has a reflectivity of greater than 60%. In an embodiment, the multilayer stack 210 formed using physical vapor deposition has a reflectivity in a range of 66%-67%. In one or more embodiments, forming the capping layer 214 over the multilayer stack 210 formed with harder materials improves reflectivity. In some embodiments, reflectivity greater than 70% is achieved using low roughness layers, clean interfaces between layers, improved layer materials, or a combination thereof.

In one or more embodiments, the capping layer 214 is a protective layer allowing the transmission of the extreme ultraviolet light. In an embodiment, the capping layer 214 is formed directly on the multilayer stack 210. In one or more embodiments, the capping layer 214 protects the multilayer stack 210 from contaminants and mechanical damage. In one embodiment, the multilayer stack 210 is sensitive to contamination by oxygen, carbon, hydrocarbons, or a combination thereof. The capping layer 214 according to an embodiment interacts with the contaminants to neutralize them.

In one or more embodiments, the capping layer 214 is an optically uniform structure that is transparent to the extreme ultraviolet light. The extreme ultraviolet light passes through the capping layer 214 to reflect off of the multilayer stack 210. In one or more embodiments, the capping layer 214 has a total reflectivity loss of 1% to 2%. In one or more embodiments, each of the different materials has a different reflectivity loss depending on thickness, but all of them will be in a range of 1% to 2%.

In one or more embodiments, the capping layer 214 has a smooth surface. For example, the surface of the capping layer 214 can have a roughness of less than 0.2 nm RMS (root mean square measure). In another example, the surface of the capping layer 214 has a roughness of 0.08 nm RMS for a length in a range of $1/100$ nm and $1/1$ μm. The RMS roughness will vary depending on the range it is measured over. For the specific range of 100 nm to 1 micron that roughness is 0.08 nm or less. Over a larger range the roughness will be higher.

The capping layer 214 can be formed in a variety of methods. In an embodiment, the capping layer 214 is formed on or directly on the multilayer stack 210 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. In one or more embodiments, the capping layer 214 has the physical characteristics of being formed by the magnetron sputtering technique including precise thickness, low roughness, and clean interfaces between the layers. In an embodiment, the capping layer 214 has the physical characteristics of being formed by the physical vapor deposition including precise thickness, low roughness, and clean interfaces between the layers.

In one or more embodiments, the capping layer 214 is formed from a variety of materials having a hardness sufficient to resist erosion during cleaning. In one embodiment, ruthenium is used as a capping layer material because it is a good etch stop and is relatively inert under the operating conditions. However, it is understood that other materials can be used to form the capping layer 214. In specific embodiments, the capping layer 214 has a thickness of in a range of 2.5 and 5.0 nm.

In one or more embodiments, an absorber layer 216 is a layer that absorbs the extreme ultraviolet light. In an embodiment, the absorber layer 216 is used to form the pattern on the reflective mask by providing areas that do not reflect the extreme ultraviolet light. The absorber layer 216, according to one or more embodiments, comprises a material having a high absorption coefficient for a particular frequency of the extreme ultraviolet light, such as about 13.5 nm. In an embodiment, the absorber layer 216 is formed directly on the capping layer 214, and the absorber layer 216 is etched using a photolithography process to form the pattern of a reflective mask.

According to one or more embodiments, the extreme ultraviolet reflective element 200, such as an extreme ultraviolet mirror, is formed with the substrate 202, the multilayer stack 210, and the capping layer 214. The extreme ultraviolet mirror has an optically flat surface and can efficiently and uniformly reflect the extreme ultraviolet light.

According to one or more embodiments, the extreme ultraviolet reflective element 200, such as an EUV mask blank, is formed with the substrate 202, the multilayer stack 210, the capping layer 214, and the absorber layer 216. The mask blank has an optically flat surface and can efficiently and uniformly reflect the extreme ultraviolet light. In an embodiment, a mask pattern is formed with the absorber layer 216 of the mask blank.

According to one or more embodiments, forming the absorber layer 216 over the capping layer 214 increases reliability of the reflective mask. The capping layer 214 acts as an etch stop layer for the absorber layer 216. When a mask pattern is etched into the absorber layer 216, the capping layer 214 beneath the absorber layer 216 stops the etching action to protect the multilayer stack 210.

Thus, a first embodiment of the disclosure comprises a Bragg reflector comprising a multilayer stack of reflective layers on a substrate. For example, the multilayer stack can be the multilayer stack 210 shown in FIG. 2A. The multilayer stack 210 of reflective layers includes a plurality of reflective layers 206, 208 including reflective layer pairs of a first material A and a second material B. For example, the first reflective layer 206 of a first material A can be silicon and the second reflective layer 208 can be of a second material B, for example molybdenum. Graded interfacial layers 212a and 212b are between the first reflective layer 206 of the first material A and the second reflective layer 208 of the second material B, wherein the graded interfacial layers have a thickness t, and the graded interfacial layers comprise a density gradient that changes across the thickness t.

In one or more embodiments, each of the graded interfacial layers 212a and 212b comprises a composition gradient that changes across the thickness.

Another embodiment comprises an EUV reflective element 200 such as an extreme ultraviolet (EUV) mask blank comprising the Bragg reflector comprising the multilayer stack 210 shown in FIG. 2A, wherein the first material A comprises molybdenum (Mo) and the second material B comprises silicon (Si).

In one or more embodiments, the graded interfacial layers 212a and 212b comprise BAN, and when the first material A comprises Si and the second material B comprises Mo, the graded interfacial layers comprise $MoSi_x$, where x is a number from 0 to 2 or 0 to 1. In some embodiments, the graded interfacial layer has gradual change in composition and/or density bridging two different materials of alternating layers. For example, for graded interfacial layer 212a between first reflective layer 206 of first material A (e.g., Si) and second reflective layer 208 of material B (e.g., Mo), the region of graded interfacial layer 212a closest to first reflective layer 206 comprised of Si is $MoSi_x$ that is rich in silicon, and the region of the graded interfacial layer 212b closest to the second reflective layer 208 comprised of Mo is $MoSi_x$ that is rich in molybdenum. Thus, the region of graded interfacial layer 212a closest to the first reflective layer 206 comprises $MoSi_x$ where x is 1 and x decreases in gradient across the graded interfacial layer 212a thickness t moving toward the second reflective layer 208 such that in the region of graded interfacial layer 212a closest to second reflective layer 208, x is 0.

For graded interfacial layer 212b between second reflective layer 208 of second material B (e.g., Mo) and first reflective layer 206' of material A (e.g., Si), the region of graded interfacial layer 212b closest to second reflective layer 208 comprised of Mo is $MoSi_x$ that is rich in Mo, and the region of the graded interfacial layer 212b closest to the first reflective layer 206' comprised of Si is $MoSi_x$ that is rich in silicon. Thus, the region of the graded interfacial layer 212b closest to the second reflective layer 208 comprised of Mo is $MoSi_x$ where x is 0, and x increases in gradient across the graded interfacial layer 212b thickness t moving closer the first reflective layer 206' such that in the region of graded interfacial layer 212b closest to first reflective layer 206', x is 1.

In some embodiments, the EUV mask blank further comprises a capping layer on the multilayer stack of reflective layers. In some embodiments, EUV mask further comprises an absorber layer on the capping layer. In some embodiments, EUV mask blank including the graded interfacial layers increases the reflectance of the multilayer stack by greater than or equal to 2% versus a comparable multilayer stack that does not comprise graded interfacial layers.

Another aspect of the disclosure pertains to a method of manufacturing Bragg reflector comprising alternating layers of first reflective material layer A and second reflective material layer B, for example, first reflective layer 206 and second reflective layer 208 shown in FIGS. 2A and 2B. The method comprises depositing a uniform first reflective material layer A on a substrate 202; forming a first graded interfacial layer 212a on the uniform first reflective material layer A, wherein the first graded interfacial layer 212a comprises a thickness t and a density gradient that changes across the thickness t; depositing a uniform second reflective material layer B on the first graded interfacial layer; and forming a second graded interfacial layer 212b on the uniform second reflective material layer B, wherein the second graded interfacial layer 212b comprises a thickness t and a density gradient that changes across the thickness t.

According to one or more embodiments, the first graded interfacial layer 212a and the second graded interfacial layer 212b each comprises a composition gradient that changes across the thickness t. In some embodiments, the first reflective material layer A comprises one of molybdenum (Mo) or silicon (Si), and the second reflective material layer B comprises the other of molybdenum (Mo) or silicon (Si). In some embodiments, the graded interfacial layer comprises $MoSi_x$.

In some embodiments, depositing the uniform first reflective material layer A and depositing the uniform second reflective material layer B comprises using a constant deposition power and a constant gas pressure in a physical deposition chamber. In some embodiments, forming the first graded interfacial layer and forming the second graded interfacial layer comprises reducing deposition power gradually and simultaneously increasing gas pressure in the deposition chamber. The phrase "deposition power" refers to power applied to a cathode in a physical vapor deposition chamber.

Another embodiment pertains to a method of manufacturing Bragg reflector, the method comprising depositing a uniform first reflective material layer A on a substrate; forming a first graded interfacial layer on the first reflective material layer A, wherein the first graded interfacial layer comprises a gradient composition; depositing a uniform second reflective material layer B on the first graded interfacial layer; and forming a second graded interfacial layer on the second reflective material layer B, wherein the second graded interfacial layer comprises a gradient composition. In some embodiments, the Bragg reflector is formed in a physical vapor deposition (PVD) chamber comprising a first material target A and a second material target B, wherein the PVD chamber comprises a rotating shield with a pair of shield hole comprising a first shield hole and a second shield hole.

In some embodiments of the method of forming the Bragg reflector, the uniform first reflective material layer A is deposited by exposing the first material target A through the first shield hole and sputtering the first material target A, the uniform second reflective material layer B is formed by exposing the second material target B through the second shield hole, and the first graded interfacial layer and the second graded interfacial layer are formed by exposing the first material target A through the first shield hole and the second material target B through the second shield hole and co-sputtering the first material target A and the second material target B.

In one or more embodiments, the uniform first reflective material layer A comprises one of molybdenum (Mo) or silicon (Si), the uniform second reflective material layer B comprises the other of molybdenum (Mo) or silicon (Si), and the first graded interfacial layer and the second graded interfacial layer each comprises $MoSi_x$. In some embodiments, depositing the uniform first reflective material layer A comprises applying a constant deposition power to a first material target A and a constant gas pressure and depositing the uniform second reflective material layer B comprises using a constant deposition power applied on a second material target B and a constant gas pressure. In some embodiments, forming the first graded interfacial layer comprises reducing deposition power applied to the first material target A and simultaneously gradually increasing deposition power applied to the second material target B.

In one or more embodiments, forming the second graded interfacial layer comprises gradually reducing deposition power applied to the second material target B and simultaneously gradually increasing the deposition power applied to the second material target A.

Figure 3A:
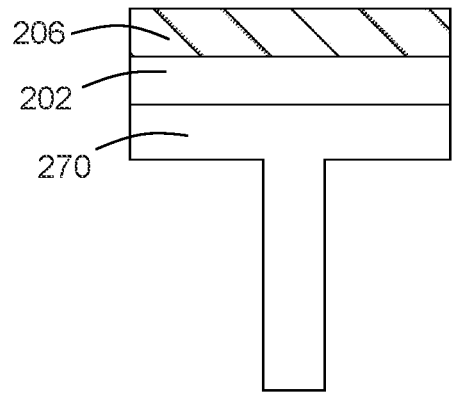
FIG. 3A illustrates a step of a process according to an exemplary embodiment to form an extreme ultraviolet reflective element including a Bragg reflector according to one or more embodiments.
Figure 3B:
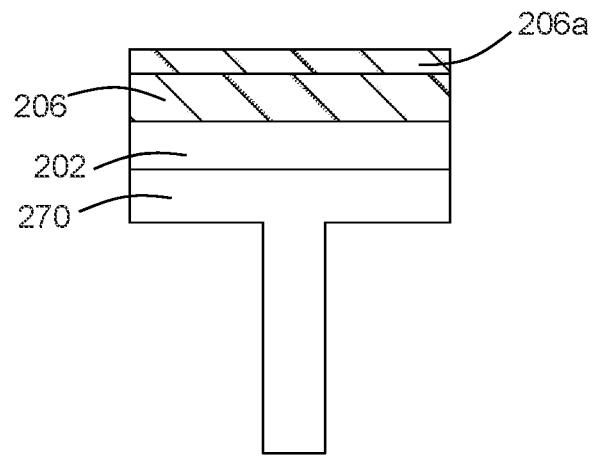
FIG. 3B illustrates a step of a process according to an exemplary embodiment to form an extreme ultraviolet reflective element including a Bragg reflector according to one or more embodiments.

Referring now to FIGS. 3A-H, a method of forming a Bragg reflector is illustrated according to one or more embodiments. According to one or more embodiments, FIGS. 3A-H show an exemplary embodiment of a deposition process illustrating density-controlled formation of graded interfacial layer. In an exemplary embodiment, alternating layers of a first reflective layer 206 comprising a first material A (e.g., Si) and a second reflective layer 208 comprising a second material B (e.g., Mo) to provide Mo/Si multilayer is shown. In FIG. 3A, which shows step (1) of the exemplary embodiment, first reflective layer 206 comprises a uniform Si layer that is deposited in a physical vapor deposition chamber using constant deposition power (e.g., in a range of 1000-1500 W) and at constant gas pressure (e.g., 0.5-3 mTorr). In FIG. 3B, which shows step (2) of the exemplary embodiment, a graded density Si layer 206a having a decreasingly graded density gradient from the bottom of the graded density Si layer 206a to the top of the graded density Si layer 206a is deposited. The graded density, which decreases from the bottom of the layer to the top of the graded density Si layer 206a, is achieved by gradually reducing deposition power applied to a silicon target in a PVD chamber and simultaneously and gradually increasing gas pressure in the PVD chamber during deposition of the graded density Si layer 206a (e.g. from 0.5 to 1 mTorr).

Figure 3C:
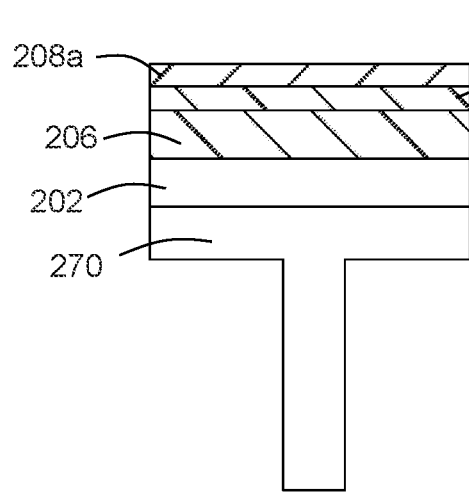
FIG. 3C illustrates a step of a process according to an exemplary embodiment to form an extreme ultraviolet reflective element including a Bragg reflector according to one or more embodiments.
Figure 3D:
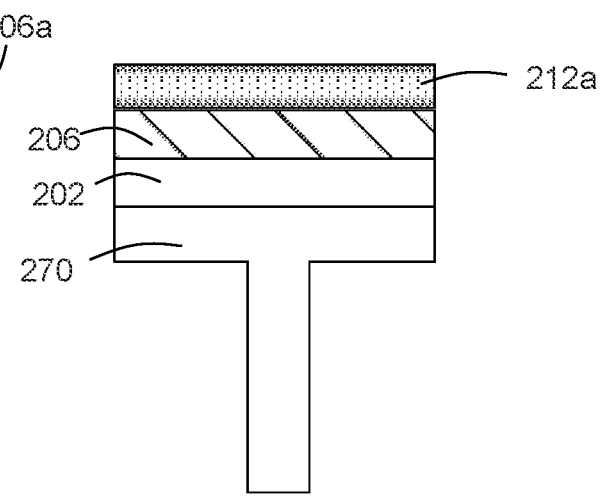
FIG. 3D illustrates a step of a process according to an exemplary embodiment to form an extreme ultraviolet reflective element including a Bragg reflector according to one or more embodiments.

In FIG. 3C, which shows step (3) of the exemplary embodiment, a thin Mo layer 208a (having a thickness of about 1 nm) is further deposited on the graded density Si layer 206a using constant deposition power applied to a Mo target (for example, 500-1000 W) and a constant gas pressure in the PVD chamber (for example, 0.5-3 mTorr). In FIG. 3D, which shows step (4) of the exemplary process, a graded interfacial layer 212a comprising $MoSi_x$ is formed on the first reflective layer 206 by heating the substrate 202 and layers at a temperature of about 100° C. for about 10 seconds. The heat can be applied by heating the substrate support 270, which can be a heated substrate support 270, causing the graded density Si layer 206a and the thin Mo layer 208a to form a graded interfacial layer 212a comprising $MoSi_x$, which is rich in silicon, adjacent first reflective layer 206, and becomes less rich in Si and more rich in Mo at the top of the graded interfacial layer 212a comprising $MoSi_x$.

Figure 3E:
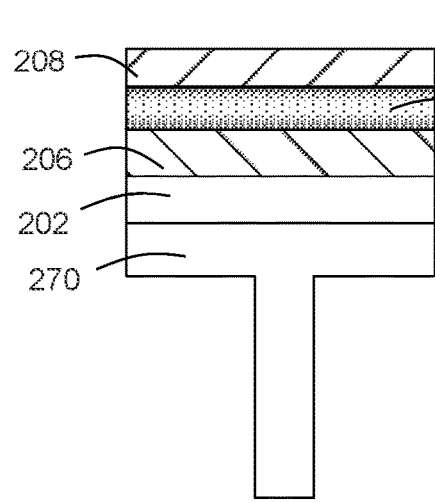
FIG. 3E illustrates a step of a process according to an exemplary embodiment to form an extreme ultraviolet reflective element including a Bragg reflector according to one or more embodiments.
Figure 3F:
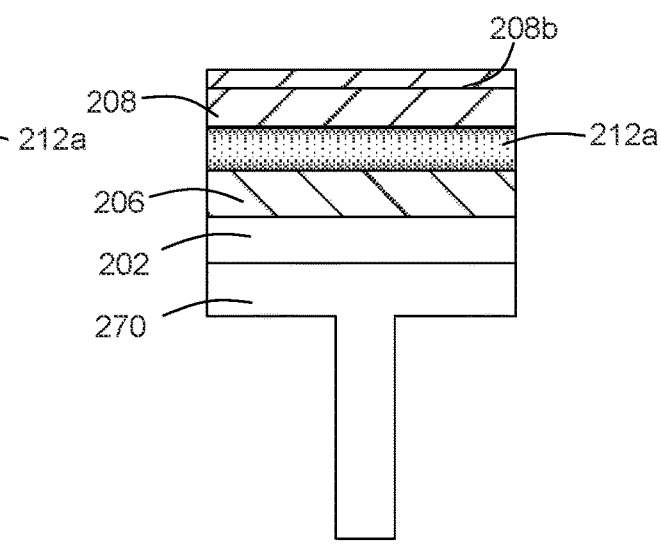
FIG. 3F illustrates a step of a process according to an exemplary embodiment to form an extreme ultraviolet reflective element including a Bragg reflector according to one or more embodiments.

In FIG. 3E, which shows step (5) of the exemplary process, a second reflective layer 208, which is a uniform Mo layer, is then deposited on top of the graded interfacial layer 212a comprising $MoSi_x$. The second reflective layer 208 is formed using constant deposition power applied to a molybdenum target (e.g., 1000-1500 W) and constant gas pressure in the PVD chamber (e.g., 0.5-3 mTorr). In FIG. 3F, which shows step (6) of the exemplary process, a graded density Mo layer 208b, having a decreasingly graded density gradient from the bottom of the graded density Mo layer 208b to the top of the graded density Si layer 208b is deposited. The graded density, which decreases from the bottom of the layer to the top of the graded density Mo layer 208b, is achieved by gradually reducing deposition power applied to a molybdenum target in a PVD chamber and simultaneously and gradually increasing gas pressure in the PVD chamber during deposition of the graded density Mo layer 208b (e.g. from 0.5 to 1 mTorr).

Figure 3G:
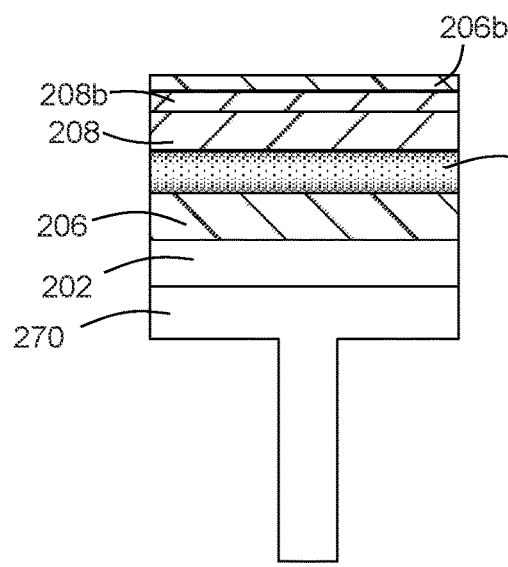
FIG. 3G illustrates a step of a process according to an exemplary embodiment to form an extreme ultraviolet reflective element including a Bragg reflector according to one or more embodiments.
Figure 3H:
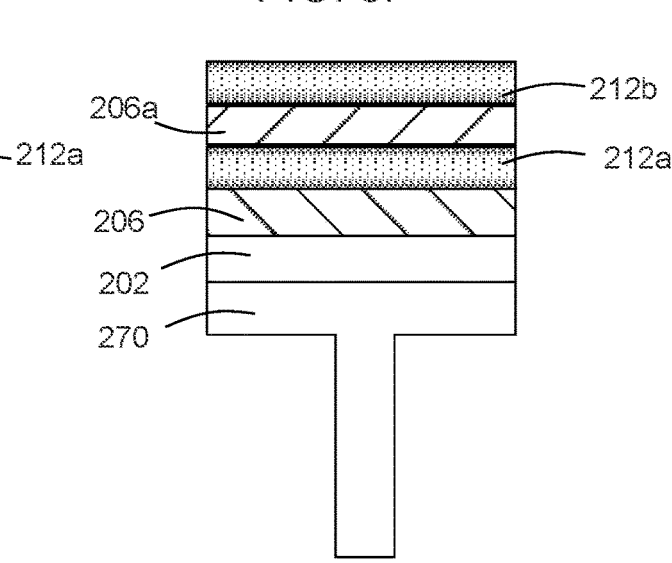
FIG. 3H illustrates a step of a process according to an exemplary embodiment to form an extreme ultraviolet reflective element including a Bragg reflector according to one or more embodiments.

In FIG. 3G, which shows step (7) of the exemplary process, a thin Si layer 206b (e.g, 1 nm in thickness) is deposited on the graded density Mo layer 208b using constant deposition power applied to a silicon target (e.g., 500-1000 W) and constant gas pressure in the PVD chamber (e.g., 0.5-3 mTorr). In FIG. 3H, which shows step (8) of the exemplary process, another graded interfacial layer 212b comprising $MoSi_x$ is formed on the thin Si layer 206b Mo layer by heating the substrate 202 and layers at a temperature of about 100° C. for about 10 seconds. The heat can be applied by heating the substrate support 270, which can be a heated substrate support 270, causing the graded density Si layer 206a and the thin Mo layer 208a to form a graded interfacial layer 212b comprising $MoSi_x$, which is rich in molybdenum, adjacent second reflective layer 208, and becomes less rich in Mo and more rich in Si at the top of the graded interfacial layer 212b.

Figure 3I:
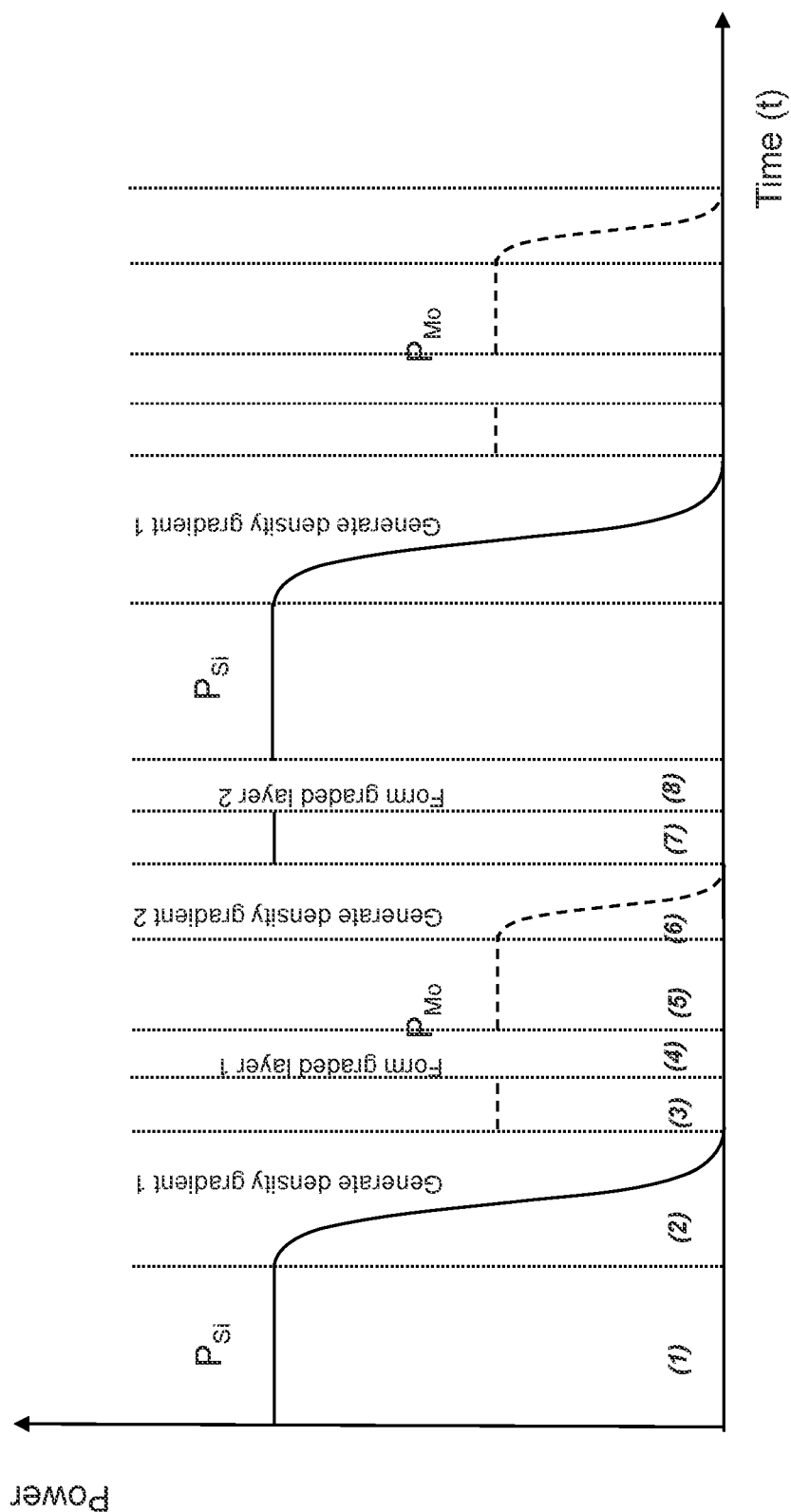
FIG. 3I is a graph showing the power applied to each of the Si and Mo targets in a PVD chamber for each of the steps with respect to FIGS. 3A-H.

FIG. 3I is a graph showing the power applied to each of the Si and Mo targets in a PVD chamber for each of the steps (1) through (8) discussed above with respect to FIGS. 3A-H for an exemplary process of the disclosure. While Si and Mo are described in the exemplary embodiment, it will be understood that the materials deposited can be any of a first material A and a second material B as discussed herein. In the specific embodiment shown graphically in FIG. 3I, the power applied to a silicon target is shown in a solid line and the power applied to a molybdenum target is shown as a dashed line. According to one or more embodiments in which the Bragg reflector is part of an EUV reflective element, the above (1)-(8) steps are repeated for 40 cycles to form 40 B/A (e.g., Mo/Si) multilayers with graded $BA_x$ (e.g., $MoSi_x$) interfacial layers between adjacent Mo and Si layers.

In another aspect of the disclosure, a composition-controlled graded interface is provided between alternating A/B layers (e.g., Si/Mo) and a method of forming the same are provided. FIGS. 4A-D show the formation of an EUV reflective element such as a mask blank including a Bragg reflector utilizing an exemplary embodiment of a composition-controlled deposition process including a graded interfacial layer with a Mo/Si multilayer as an example. The Bragg reflector can be formed Co-sputtering rotating method is used and Mo and Si targets are exposed all the time during deposition without moving the rotating shield.

Figure 4A:
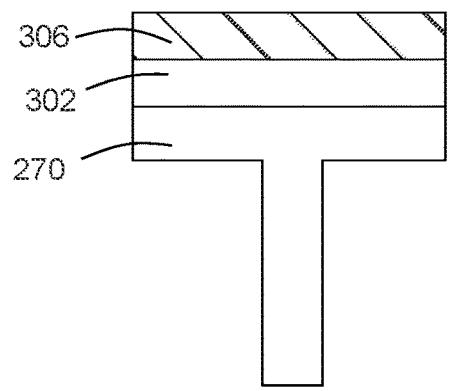
FIG. 4A illustrates a step of a process according to an exemplary embodiment to form an extreme ultraviolet reflective element including a Bragg reflector according to one or more embodiments.
Figure 4B:
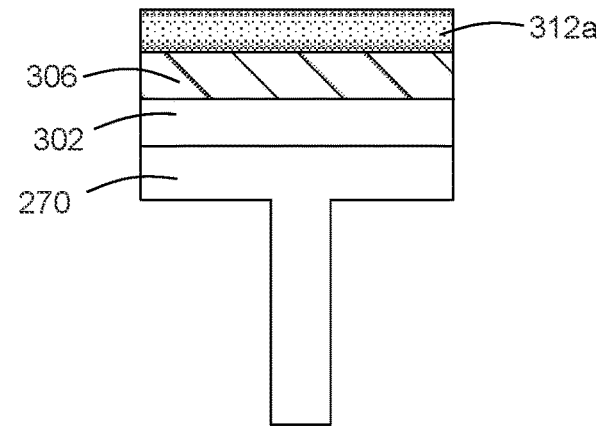
FIG. 4B illustrates a step of a process according to an exemplary embodiment to form an extreme ultraviolet reflective element including a Bragg reflector according to one or more embodiments.

In FIG. 4A, which shows step (1) of the exemplary process, a first reflective layer 306 comprising uniform Si layer is firstly deposited on substrate 302 in a PVD chamber using constant deposition power applied to a silicon target (e.g., $P_{Si}$, 1000-1500 W) and at a constant gas pressure in the PVD chamber (e.g., 0.5-3 m Torr). In FIG. 4B, which shows step (2) of the exemplary process, after step (1), power applied to the Si target is gradually decreased, for example, from $P_{Si}$ to 0 and simultaneously power applied to a Mo target is gradually increased from 0 to $P_{Mo}$, forming a graded Mo/Si interfacial layer 312a on top of the previous first reflective layer 306 comprising Si layer gradient composition across the thickness.

Figure 4C:
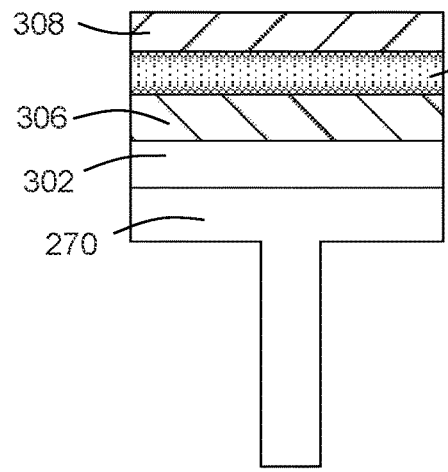
FIG. 4C illustrates a step of a process according to an exemplary embodiment to form an extreme ultraviolet reflective element including a Bragg reflector according to one or more embodiments.
Figure 4D:
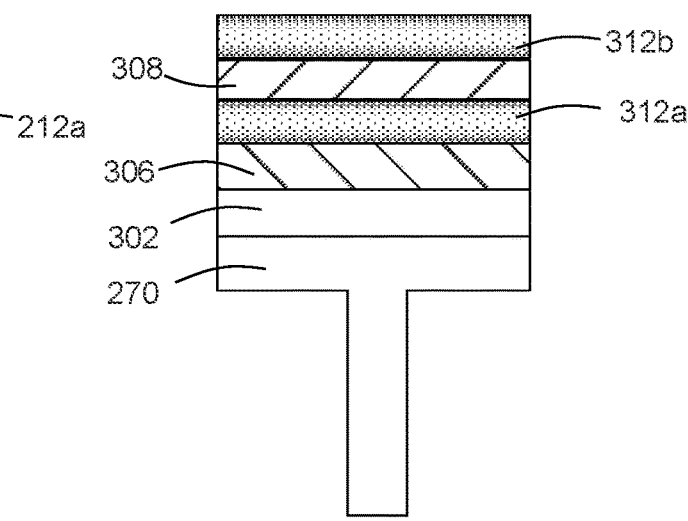
FIG. 4D illustrates a step of a process according to an exemplary embodiment to form an extreme ultraviolet reflective element including a Bragg reflector according to one or more embodiments.

In FIG. 4C, which shows step (3) of the exemplary process, a second reflective layer 308 comprising uniform Mo layer is deposited on the graded Mo/Si interfacial layer 312a using a constant deposition power (e.g., $P_{Mo}$, 500-1000 W) applied to a Mo target and constant gas pressure in the PVD chamber (e.g., 0.5-3 mTorr). In FIG. 4D, which shows step (4) of the exemplary process, after step (3), power applied to the Mo target is gradually decreased from $P_{Mo}$ to 0, and simultaneously power is applied to the Si target, which is gradually increased from 0 to $P_{Si}$, forming a graded Mo/Si interfacial layer 312*b* on top of the second reflective layer 312 comprising Mo with a gradient composition across the thickness of the grade Mo/Si interfacial layer.

Figure 4E:
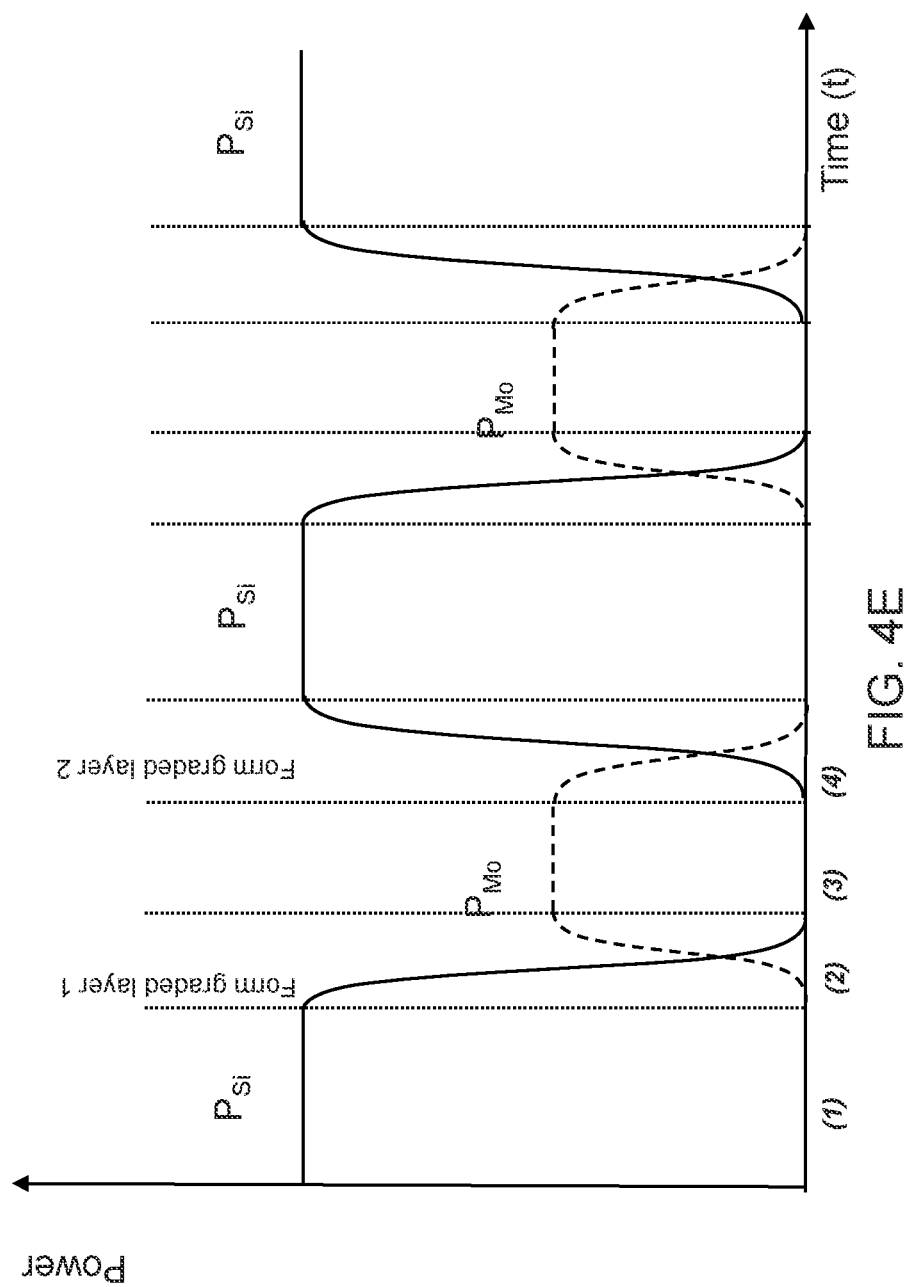
FIG. 4E is a graph showing the power applied to each of the Si and Mo targets in a PVD chamber for each of the steps with respect to FIGS. 4A-D.

FIG. 4E is a graph showing the power applied to each of the Si and Mo targets in a PVD chamber for each of the steps with respect to FIGS. 4A-D According to one or more embodiments in which the Bragg reflector is part of an EUV reflective element, the above (1)-(4) steps are repeated for 40 cycles to form 40 B/A (e.g., Mo/Si) multilayers with graded $BA_x$ (e.g., $MoSi_x$) interfacial layers between adjacent Mo and Si layers.

Figure 5:
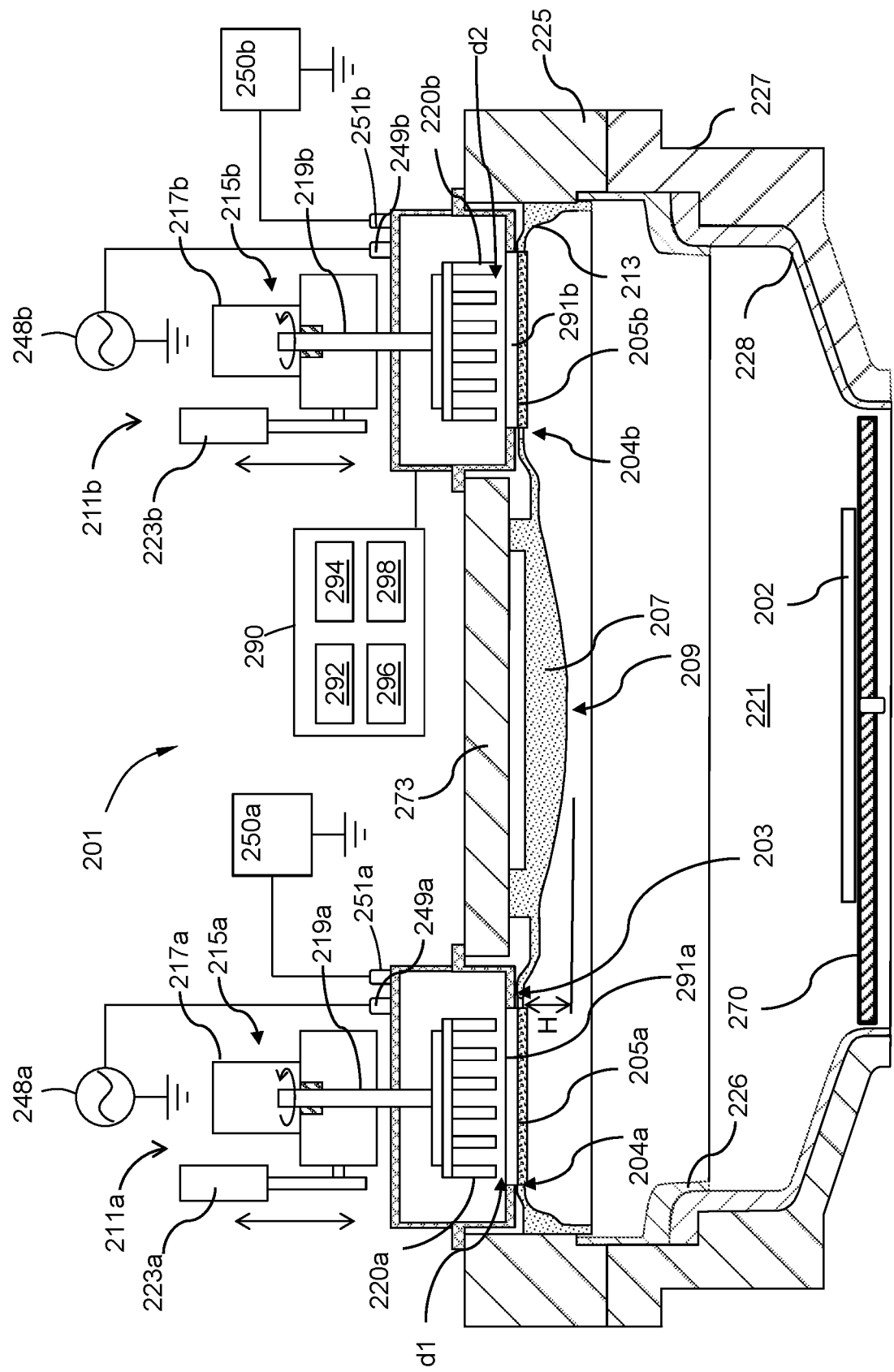
FIG. 5 is a side view of a physical vapor deposition (PVD) chamber according to one or more embodiments.

FIG. 5 depicts a PVD chamber 201 in accordance with a first embodiment of the disclosure. PVD chamber 201 includes a plurality of cathode assemblies 211*a* and 211*b*. While only two cathode assemblies 211*a* and 211*b* are shown in the side view of FIG. 5, a multicathode chamber can comprise more than two cathode assemblies, for example, five, six or more than six cathode assemblies. An upper shield 213 is provided below the plurality of cathode assemblies 211*a* and 211*b*, the upper shield 213 having two shield holes 204*a* and 204*b* to expose targets 205*a*, 205*b* disposed at the bottom of the cathode assemblies 211*a* and 211*b* to the interior space 221 of the PVD chamber 201. A middle shield 226 is provided below and adjacent upper shield 213, and a lower shield 228 is provided below and adjacent upper shield 213.

A modular chamber body is disclosed in FIG. 5, in which an intermediate chamber body 225 is located above and adjacent a lower chamber body 227. The intermediate chamber body 225 is secured to the lower chamber body 227 to form the modular chamber body, which surrounds lower shield 228 and the middle shield. A top adapter lid 273 is disposed above intermediate chamber body 225 to surround upper shield 213.

PVD chamber 201 is also provided with a rotating substrate support 270, which can be a rotating pedestal to support the substrate 202. The rotating substrate support 270 can also be heated by a resistance heating system. The PVD chamber 201 comprises a plurality of cathode assemblies including a first cathode assembly 211*a* including a first backing plate 291*a* configured to support a first target 205*a* during a sputtering process and a second cathode assembly 211*b* including a second backing plate 291*b* configured to support a second target 205*b* during a physical vapor deposition or sputtering process. The PVD chamber 201 further comprises an upper shield 213 below the plurality of cathode assemblies 211*a*, 211*b* having a first shield hole 204*a* having a diameter D1 and positioned on the upper shield to expose the first cathode assembly 211*a* and a second shield hole 204*b* having a diameter D2 and positioned on the upper shield 213 to expose the second cathode assembly 211*b*, the upper shield 213 having a substantially flat inside surface 203, except for a region 207 between the first shield hole 204*a* and the second shield hole 204*b*.

Figure 6:
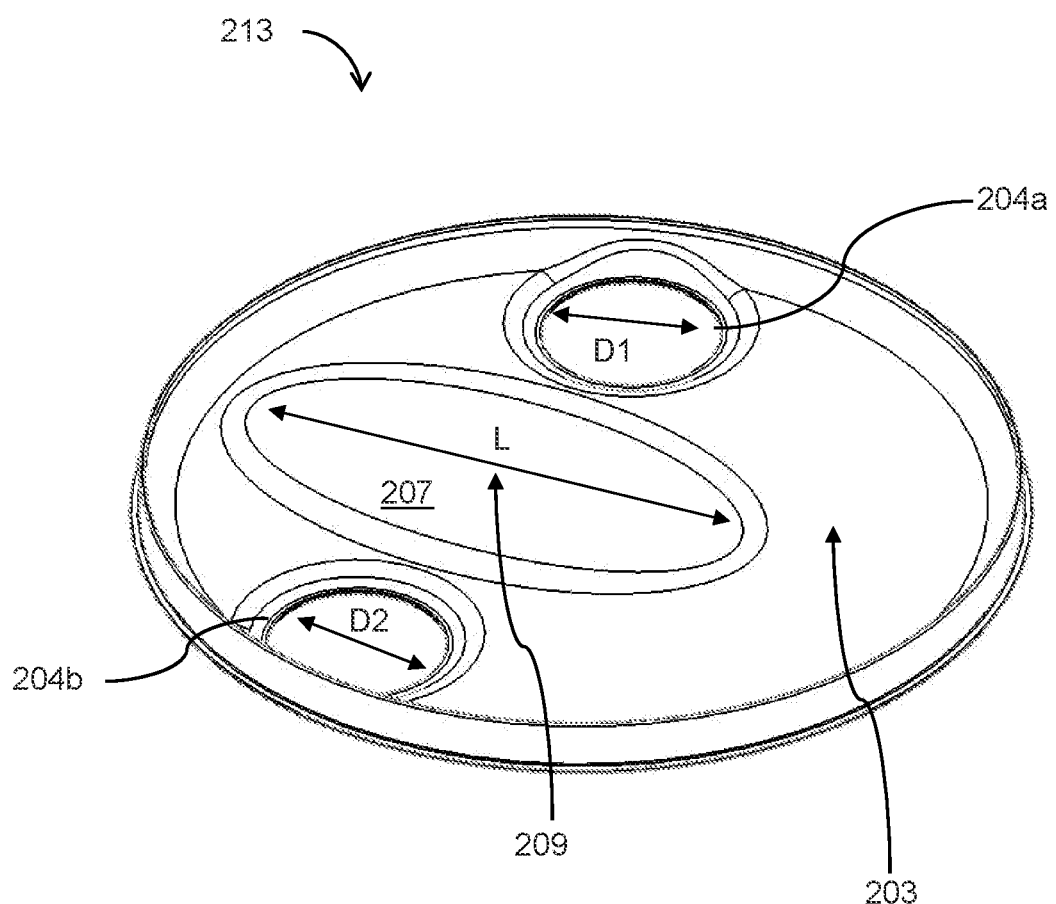
FIG. 6 is a bottom isometric view of the upper shield of the PVD chamber of FIG. 5.

As best shown in FIG. 6, the upper shield 213 includes a raised area 209 in the region 207 between the first shield hole and the second shield hole, the raised area 209 having a height "H" from the substantially flat inside surface 203 that greater than one centimeter from the flat inside surface 203 and having a length "L" greater than the diameter D1 of the first shield hole 204*a* and the diameter D2 of the second shield hole 204*b*, wherein the PVD chamber is configured to alternately sputter material from the first target 205*a* and the second target 205*b* without rotating the upper shield 213.

In one or more embodiments, the raised area 209 has a height H so that during a sputtering process, the raised area height H is sufficient to prevents material sputtered from the first target 205*a* from being deposited on the second target 205*b* and to prevent material sputtered from the second target 205*b* from being deposited on the first target 205*a*.

According to one or more embodiments of the disclosure, the first cathode assembly 211*a* comprises a first magnet spaced apart from the first backing plate 291*a* at a first distance d1 and the second cathode assembly 211*b* comprises a second magnet 220*b* spaced apart from the second backing plate 291*b* at a second distance d2, wherein the first magnet 220*a* and the second magnet 220*b* are movable such that the first distance d1 can be varied and the second distance d2 can be varied. The distance d1 and the distance d2 can be varied by linear actuator 223*a* to change the distance d1 and linear actuator 223*b* to change the distance d2. The linear actuator 223*a* and the linear actuator 223*b* can comprise any suitable device that can respectively affect linear motion of first magnet assembly 215*a* and second magnet assembly 215*b*. First magnet assembly 215*a* includes rotational motor 217*a*, which can comprise a servo motor to rotate the first magnet 220*a* via shaft 219*a* coupled to rotational motor 217*a*. Second magnet assembly 215*b* includes rotational motor 217*b*, which can comprise a servo motor to rotate the second magnet 220*b* via shaft 219*b* coupled to rotational motor 217*b*. It will be appreciated that the first magnet assembly 215*a* may include a plurality of magnets in addition to the first magnet 220*a*. Similarly, the second magnet assembly 215*b* may include a plurality of magnets in addition to the second magnet 220*b*.

In one or more embodiments, wherein the first magnet 220*a* and second magnet 220*b* are configured to be moved to decrease the first distance d1 and the second distance d2 to increase magnetic field strength produced by the first magnet 220*a* and the second magnet 220*b* and to increase the first distance d1 and the second distance d2 to decrease magnetic field strength produced by the first magnet 220*a* and the second magnet 220*b*.

In some embodiments, the first target 205*a* comprises a molybdenum target and the second target 205*b* comprises a silicon target, and the PVD chamber 201 further comprises a third cathode assembly (not shown) including a third backing plate to support a third target 205*c* and a fourth cathode assembly (not shown) including a fourth backing plate configured to support a fourth target 205*d*. The third cathode assembly and fourth cathode assembly according to one or more embodiments are configured in the same manner as the first and second cathode assemblies 211*a*, 211*b* as described herein. In some embodiments, the third target 205*c* comprises a dummy target and the fourth target 205*d* comprises a dummy target. As used herein, "dummy target" refers to a target that is not intended to be sputtered in the PVD apparatus 201.

Plasma sputtering may be accomplished using either DC sputtering or RF sputtering in the PVD chamber 201. In some embodiments, the process chamber includes a feed structure for coupling RF and DC energy to the targets associated with each cathode assembly. For cathode assembly 211*a*, a first end of the feed structure can be coupled to an RF power source 248*a* and a DC power source 250*a*, which can be respectively utilized to provide RF and DC energy to the first target 205*a*. The RF power source 248*a* is coupled to RF power in 249*a* and the DC power source 250*a* is coupled to DC power in 251*a*. For example, the DC power source 250*a* may be utilized to apply a negative voltage, or bias, to the target 305*a*. In some embodiments, RF energy supplied by the RF power source 248*a* may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

Likewise, for cathode assembly 211b, a first end of the feed structure can be coupled to an RF power source 248b and a DC power source 250b, which can be respectively utilized to provide RF and DC energy to the second target 205b. The RF power source 248b is coupled to RF power in 249b and the DC power source 250b is coupled to DC power in 251b. For example, the DC power source 250b may be utilized to apply a negative voltage, or bias, to the second target 205b. In some embodiments, RF energy supplied by the RF power source 248b may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

While the embodiment shown includes separate RF power sources 248a and 248b for cathode assemblies 211a and 211b, and separate DC power sources 250a and 250b for cathode assemblies 211a and 211b, the PVD chamber can comprise a single RF power source and a single DC power source with feeds to each of the cathode assemblies.

In some embodiments, the methods described herein are conducted in the PVD chamber 201 equipped with a controller 290. There may be a single controller or multiple controllers. When there is more than one controller, each of the controllers is in communication with each of the other controllers to control of the overall functions of the PVD chamber 201. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller can comprise processor 292, a memory 294 coupled to the processor, input/output devices coupled to the processor 292, and support circuits 296 and 298 to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. In some embodiments, the controller is connected to and configured to operate intermediate components to perform the functions of the methods.

The target shown in FIG. 6 and the PVD chamber 201 shown in FIG. 5 can be used to practice the method with respect to FIGS. 4A-D. In one or more embodiments, Mo and Si targets are exposed during deposition without rotating the upper shield 213.

Referring now to FIGS. 7A-C, another embodiment of a composition-controlled method to form B/A (e.g., Mo/Si) multilayers with graded interfacial $BA_x$ (e.g., $MoSi_x$ interfacial layer is deposit Mo, Si and $MoSi_x$) layers separately is shown. According to the embodiment shown in FIGS. 7A-C, via placing a rotating upper shield 213 in a PVD chamber as shown in FIGS. 5 and 6.

Referring to FIGS. 7A-C, a first target 205a comprising Si (positioned under first cathode assembly 211a) is at position P1, the second target 205b (positioned under second cathode assembly 211b) is at position P2. Dummy target 205c is placed at position P3 (under a third cathode assembly (not shown)), and dummy target 205d is placed at position P4 (under a fourth cathode assembly (not shown)). In some embodiments, the raised area 209 in region 207 is positioned between first shield hold 204a and second shield hole 204b, however, the raised area 209 in region 207 is not required according to one or more embodiments.

Referring now to FIG. 7A, in step (1) of an exemplary embodiment of a process, the first shield hole 204a of rotating upper shield 213 exposes the second target 205b comprising Si and the second shield hole 204b is placed at dummy target 205d preventing re-deposition and contamination during deposition of silicon. The side and front surface of the dummy target 205d is arc spray textured to ensure no particle generation after large amount of deposition. In the configuration shown in FIG. 7A, a uniform Si layer is deposited on the substrate 202 by applying a constant deposition power to the second target 205b comprising silicon (e.g., $P_{Si}$, 1000-1500 W) and a constant gas pressure in the PVD chamber 201 (e.g., 0.5-3 mTorr).

In step (2) of the exemplary process as shown in FIG. 7B, the shield 213 is rotated in the direction of arrow 260 so that the first shield hole 204a exposes the first target 205a comprising molybdenum and the second shield hole 204b exposes the second target 205b comprising silicon such that both the Si target and the Mo target are exposed through the two shield holes 204a, 204b of the upper shield 213. Deposition power type (RF, DC and pulsed DC) and parameters for Mo and Si targets are controlled as a function of time during co-sputtering process to form a graded interfacial $MoSi_x$ layer. Mo and Si can be co-sputtered using 1 of the 9 combinations of power types of DC, RF and pulsed DC (PDC). Power parameters to be controlled are listed in Table 1.

TABLE 1

| Parameters | Mo/DC | Mo/RF | Mo/PDC |
|---|---|---|---|
| Si/DC | Mo/DC: Power<br>Si/DC: Power | Mo/RC: Power<br>and/or Frequency<br>Si/DC: Power | Mo/PDC: Power<br>and/or Frequency<br>Si/DC: Power |
| Si/RF | Mo/DC: Power<br>Si/RF: Power<br>and/or Frequency | Mo/RF: Power<br>and/or Frequency<br>Si/RF: Power<br>and/or Frequency | Mo/PDC: Power<br>and/or Frequency<br>Si/RF: Power<br>and/or Frequency |
| Si/PDC | Mo/DC: Power<br>Si/PDC: Power<br>and/or Frequency | Mo/RF: Power<br>and/or Frequency<br>Si/PDC: Power<br>and/or Frequency | Mo/PDC: Power<br>and/or Frequency<br>Si/PDC: Power<br>and/or Frequency |

In step (3) of the exemplary process shown in FIG. 7C, the upper shield 213 is rotated in the direction of arrow 260 so that the second shield hole 204b is rotated to expose the first target 205a comprising Mo and the first shield hole 204a is positioned over dummy target 205c, preventing re-deposition and contamination. A uniform Mo layer is deposited using constant deposition power (e.g., $P_{Mo}$, 500-1000 W) applied to the first target 205a comprising Mo at a constant gas pressure in the PVD chamber 201 (e.g, 0.5-3 mTorr).

In step (4) of the exemplary process, the upper shield 213 is rotated again to the position shown in FIG. 7B to expose both the first target 205a comprising Mo and the second target 205b comprising Si. A interfacial $MoSi_x$ layer is formed as described in step (2).

According to one or more embodiments in which the Bragg reflector is part of an EUV reflective element, the above (1)-(4) steps are repeated for 40 cycles to form 40 B/A (e.g., Mo/Si) multilayers with graded $BA_x$ (e.g., $MoSi_x$) interfacial layers between adjacent Mo and Si layers. An advantage of the method disclosed with respect to FIGS. 7A-C is that when depositing Mo or Si layer, there is no cross contamination on the other targets (Si or Mo target). In addition, deposition of graded interfacial $MoSi_x$ layer is precisely controlled. Furthermore, a variety of power parameters are available for controlling and optimizing graded Interfacial layers.

The controller 290 of the PVD chamber 201 can be used to control any of the processes described herein. The controller 290 can send control signals to activate a DC, RF or pulsed DC power source, and control the power applied to the respective targets during deposition. Furthermore, the controller can send control signals to adjust the gas pressure in the PVD chamber 201. The controller 290 can also be used to control rotation of the upper shield 213 during each of the processes described above.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing a Bragg reflector comprising alternating layers of first reflective material layer A and second reflective material layer B, the method comprising:
   depositing a uniform first reflective material layer A on a substrate;
   forming a first graded interfacial layer on the uniform first reflective material layer A, wherein the first graded interfacial layer comprises a thickness and a density gradient that changes across the thickness;
   depositing a uniform second reflective material layer B on the first graded interfacial layer; and
   forming a second graded interfacial layer on the uniform second reflective material layer B, wherein the second graded interfacial layer comprises a thickness and a density gradient that changes across the thickness, wherein the Bragg reflector is formed in a physical vapor deposition (PVD) chamber comprising a first material target A and a second material target B, wherein the PVD chamber comprises a rotating shield with a pair of shield holes comprising a first shield hole and a second shield hole.

2. The method of claim 1, wherein the first graded interfacial layer and the second graded interfacial layer each comprises the first material A and the second material B and a composition gradient that changes across the thickness.

3. The method of claim 2, wherein the first reflective material layer A comprises one of molybdenum (Mo) or silicon (Si), and the second reflective material layer B comprises the other of molybdenum (Mo) or silicon (Si).

4. The method of claim 2, wherein the first graded interfacial layer and the second graded interfacial layer independently comprise $MoSi_x$.

5. The method of claim 2, wherein depositing the uniform first reflective material layer A and depositing the uniform second reflective material layer B comprises using a constant deposition power and a constant gas pressure.

6. The method of claim 2, wherein forming the first graded interfacial layer and forming the second graded interfacial layer comprises reducing deposition power gradually and simultaneously increasing gas pressure.

7. A method of manufacturing a Bragg reflector, the method comprising:
   depositing a uniform first reflective material layer A on a substrate;
   forming a first graded interfacial layer on the first reflective material layer A, wherein the first graded interfacial layer comprises a gradient composition;
   depositing a uniform second reflective material layer B on the first graded interfacial layer; and
   forming a second graded interfacial layer on the second reflective material layer B, wherein the second graded interfacial layer comprises a gradient composition, wherein the first graded interfacial layer and the second graded interfacial layer each comprises the first material A and the second material B.

8. The method of claim 7, wherein the Bragg reflector is formed in a physical vapor deposition (PVD) chamber comprising a first material target A and a second material target B, wherein the PVD chamber comprises a rotating shield with a pair of shield hole comprising a first shield hole and a second shield hole.

9. The method of claim 8, wherein the uniform first reflective material layer A is deposited by exposing the first material target A through the first shield hole and sputtering the first material target A, the uniform second reflective material layer B is formed by exposing the second material target B through the second shield hole, and the first graded interfacial layer and the second graded interfacial layer are formed by exposing the first material target A through the first shield hole and the second material target B through the second shield hole and co-sputtering the first material target A and the second material target B.

10. The method of claim 9, wherein the uniform first reflective material layer A comprises one of molybdenum (Mo) or silicon (Si), the uniform second reflective material layer B comprises the other of molybdenum (Mo) or silicon (Si), and the first graded interfacial layer and the second graded interfacial layer each comprises $MoSi_x$.

11. The method of claim 9, wherein depositing the uniform first reflective material layer A comprises applying a constant deposition power to a first material target A and a constant gas pressure and depositing the uniform second reflective material layer B comprises using a constant deposition power applied on a second material target B and a constant gas pressure.

12. The method of claim 9, wherein forming the first graded interfacial layer comprises reducing deposition power applied to the first material target A and simultaneously gradually increasing deposition power applied to the second material target B.

13. The method of claim 12, wherein forming the second graded interfacial layer comprises gradually reducing deposition power applied to the second material target B and simultaneously gradually increasing the deposition power applied to the first material target A.

14. The method of claim 8, wherein the graded interfacial layers have a first region rich in material A adjacent to the first layer and a second region rich in material B adjacent to the second layer.

15. The method of claim 10, wherein where x is a number from 0 to 2, and the material A comprises Si and the material B comprises Mo.

16. The EUV mask blank of claim 15, wherein the graded interfacial layers have a first region rich in Mo adjacent to the first layer and a second region rich in Si adjacent to the second layer.

* * * * *